US006781381B2

(12) United States Patent
Parker

(10) Patent No.: US 6,781,381 B2
(45) Date of Patent: Aug. 24, 2004

(54) ELECTRIC ARC SYNTHESIS FOR ARC DETECTOR TESTING AND METHOD FOR ARC TESTING

(75) Inventor: Michael T. Parker, Camarillo, CA (US)

(73) Assignee: Hendry Mechanical Works, Goleta, CA (US)

( * ) Notice: Subject to any disclaimer, the term of this patent is extended or adjusted under 35 U.S.C. 154(b) by 0 days.

(21) Appl. No.: 10/160,547

(22) Filed: May 31, 2002

(65) Prior Publication Data

US 2003/0160619 A1 Aug. 28, 2003

Related U.S. Application Data

(60) Provisional application No. 60/295,139, filed on Jun. 1, 2001.

(51) Int. Cl.[7] ............................................. G01R 31/327
(52) U.S. Cl. ...................................................... 324/424
(58) Field of Search ................................ 324/536, 520, 324/509, 424; 361/42, 45, 5, 64; 702/124

(56) References Cited

U.S. PATENT DOCUMENTS

| 5,729,145 A | 3/1998 | Blades | ........................ 324/536 |
| 6,191,589 B1 | 2/2001 | Clunn | ........................ 324/424 |
| 6,426,632 B1 * | 7/2002 | Clunn | ........................ 324/509 |

FOREIGN PATENT DOCUMENTS

FR        2571888        4/1986

OTHER PUBLICATIONS

Patent Abstracts of Japan, vol. 1997, No. 10, Oct. 31, 1997 and JP09 166651 (Nissin Electric Co. LTD), Jun. 24, 1997 abstract.
AVTECH, AV–110 Series, AV–112 Sereis, Data Sheet, p. 87, undated.
High Voltage Amplifier and Modulator A–303, A–303 Piezo Amplifier and Modulator, p. 1–5, undated.

* cited by examiner

*Primary Examiner*—N. Le
*Assistant Examiner*—Amy He
(74) *Attorney, Agent, or Firm*—Koppel, Jacobs, Patrick & Heybl

(57) ABSTRACT

A system for arc detection testing using synthesized arcs is disclosed, which uses voltage and current waveform generators to generate an arc's analog form voltage and current waveform from a digital form of the arc's captured waveforms. A voltage waveform amplifier and a current waveform amplifier are included, with the outputs of the voltage and current waveform generators coupled to the inputs of the voltage and current waveform amplifiers, respectively. The outputs of the voltage and current waveform amplifiers are connected in circuit to a device under test to test the device's response to the waveforms. A method for testing a device's response to a simulated arcing condition is also disclosed. An electric arc's voltage and current waveforms are captured in digital form. Analog form voltage and current waveform are generated from the captured digital voltage and current waveforms. The analog form voltage and current waveforms are applied to a device under test and the device is monitored to determine its response to the waveforms.

43 Claims, 6 Drawing Sheets

ELECTRIC ARC SYNTHESIS FOR ARC DETECTOR TESTING AND METHOD FOR ARC TESTING

This application claims the benefit of provisional application serial No. 60/295,139 also to Parker, which was filed on Jun. 1, 2001.

BACKGROUND OF THE INVENTION

1. Field of the Invention

This invention relates to electrical circuit testing generally and more specifically to testing of arc detectors, circuit interrupters or circuit breakers.

2. Description of the Related Art

Arc detection in electrical circuits is important for both safety and reliability purposes. In some critical applications, such as circuits near flammable fluids, electrical arcing foreshadow or immediately cause disastrous consequences. For example, arcing has been suspected as the cause of several major airline crashes, resulting in tragic loss of life and major economic damages.

Numerous electrical arc protection devices have been developed ranging from the traditional fuse to sophisticated circuits utilizing digital signal processing techniques. Arc detection systems have also been developed in AC power systems and include monitoring the power waveform for wideband high frequency noise and examining the detected noise to find patterns of variation synchronized to the power waveform. See for example, U.S. Pat. No. 5,729,145 to Blades (1998); Blades includes a survey of prior art arc detection patents. High frequency noise monitoring methods do not allow the monitoring system to respond to frequency components of the arc signature that may lie in the general frequency range of the AC fundamental. Furthermore, false alarms are not precluded by such methods, which still respond to harmonics of the AC fundamental, whether or not arc related.

Some previous methods (including that of the Blades Pat. No. 5,729,145) require that the spectrum of the arc signature be correlated to line frequency fundamentals. Such methods do not adequately detect more chaotic arc signatures, and they are plagued by false alarms related to transient load conditions, which are often well correlated to line frequencies.

As a result of the number of new arc detection devices and problems with false alarms, there is a need for an efficient method by which arc detection devices can be objectively tested and qualified under circumstances that simulate "real-world" conditions. The simulation of electrical arcs is made difficult by the uncontrolled, chaotic nature of the physical phenomenon of the arc. Many distinct types of arcs are known to occur, having different physical and electrical characteristics. Ideally, a testing method should be well controlled but capable of duplicating a wide variety of electrical arc "signatures" in a repeatable fashion. It should test the arc detection device both for its capability to detect arcs and for its predilection for false alarms. It should be easily updated with new standards and knowledge, and it should allow thorough testing at moderate cost.

Some conventional approaches to arc simulation are crude. For example, a (multiconductor) cable can be sliced by a razor in a Guillotine-like test jig. Other mechanical methods have been proposed, including dripping saline solution onto neighboring conductors, or inducing thermal insulation failure. These methods are messy, inconvenient, and are not quantitative or reproducible.

There are also arcing conditions/variations that are difficult to simulate using these relatively crude testing methods. For instance propagation of an arc through the lines of a system can change the arc signal's characteristics, particularly at high frequency. The characteristics of an arc signal can change with the impedance of the unit under arc simulation test. When an arcing signal passes down a particular line, it can cause a signal to be generated in a proximal line, which is extremely difficult to simulate using conventional methods. Varied loads can also impact the arcing signal's characteristics, which is important because one focus of arc testing is to prove no false trips under load. Combining different condition permutations requires each condition to be individually embodied in the test equipment, which is both cumbersome and expensive. Change in the frequency of the system can have significant impact on the device under test. Most of these variations are simply impractical to simulate using conventional arc simulators.

Recently, efforts have been undertaken to capture arcing waveforms so that the arcing phenomenon can be studied and better understood. A number of waveforms have been captured and stored in digital form, and have been analyzed and catalogued. Some of the entities who capture, analyze and catalogue arc waveforms include the Boeing Company, the Navy, the Federal Aviation Administration (FAA) and Texas Instruments Incorporated.

SUMMARY OF THE INVENTION

The present invention seeks to provide a method and apparatus for reproducing an electrical signal, which controllably simulates the electrical conditions that accompany electrical arcing. The invention also includes a system and method of testing the response devices such as arc detectors, circuit interrupters or circuit breakers electrical, to arcing conditions.

One embodiment of the invention comprises a system for synthesizing electrical arcs for arc detector testing using the arc's captured current and voltage waveforms. A voltage waveform generator generates an analog voltage waveform from a digital form of an arc's captured voltage waveform. A current waveform generator generates an analog current waveform from a digital form of an arc's captured current waveform. The analog voltage and current waveforms are sequenced in time to synthesize the arcing condition created by the arc's current and voltage waveforms.

Another embodiment of the invention comprises a system for arc detection testing using synthesized arcs. This system uses similar voltage and current waveform generators to generate an arc's analog form voltage and current waveform from a digital form of the arc's captured waveforms. The voltage and current waveforms are also sequenced in time. A voltage waveform amplifier is included with the output of the voltage waveform generator connected in circuit with the input of said voltage waveform amplifier. A current waveform amplifier is also included, the output of the current waveform generator connected in circuit with the input of the current waveform amplifier. The output of voltage and current waveform amplifiers connected in circuit to a device under test to test its response to the waveforms.

A method for testing a device's response to a simulated arcing condition is also disclosed. An electric arc's voltage and current waveforms are captured in digital form. An analog form voltage and current waveform is generated from said captured digital voltage and current waveforms. The analog form voltage and current waveforms are applied to a device under test and the device is monitored to determine its response to the analog waveforms.

The invention has many advantages over prior arc syntheses testing systems and methods. The invention allows for manipulation of the arc waveform to simulate different signal propagations and system impedances. The invention can combine different waveforms to use load signatures in combination with arc signatures to prove no false trips.

The invention can also validate brown-out conditions and operating characteristics. It can also simulate proximity of the device under test to the arcing condition, which can changes the characteristics of the signal experienced by the device under test. The new tester allows countless permutations of conditions to be more efficiently simulated by programming them into the simulated waveforms. The invention also allows for arc testing of the device at different frequencies.

These and other features and advantages of the invention will be apparent to those skilled in the art from the following detailed description of preferred embodiments, taken together with the accompanying drawings, in which:

DETAILED DESCRIPTION OF THE INVENTION

Figure 1:
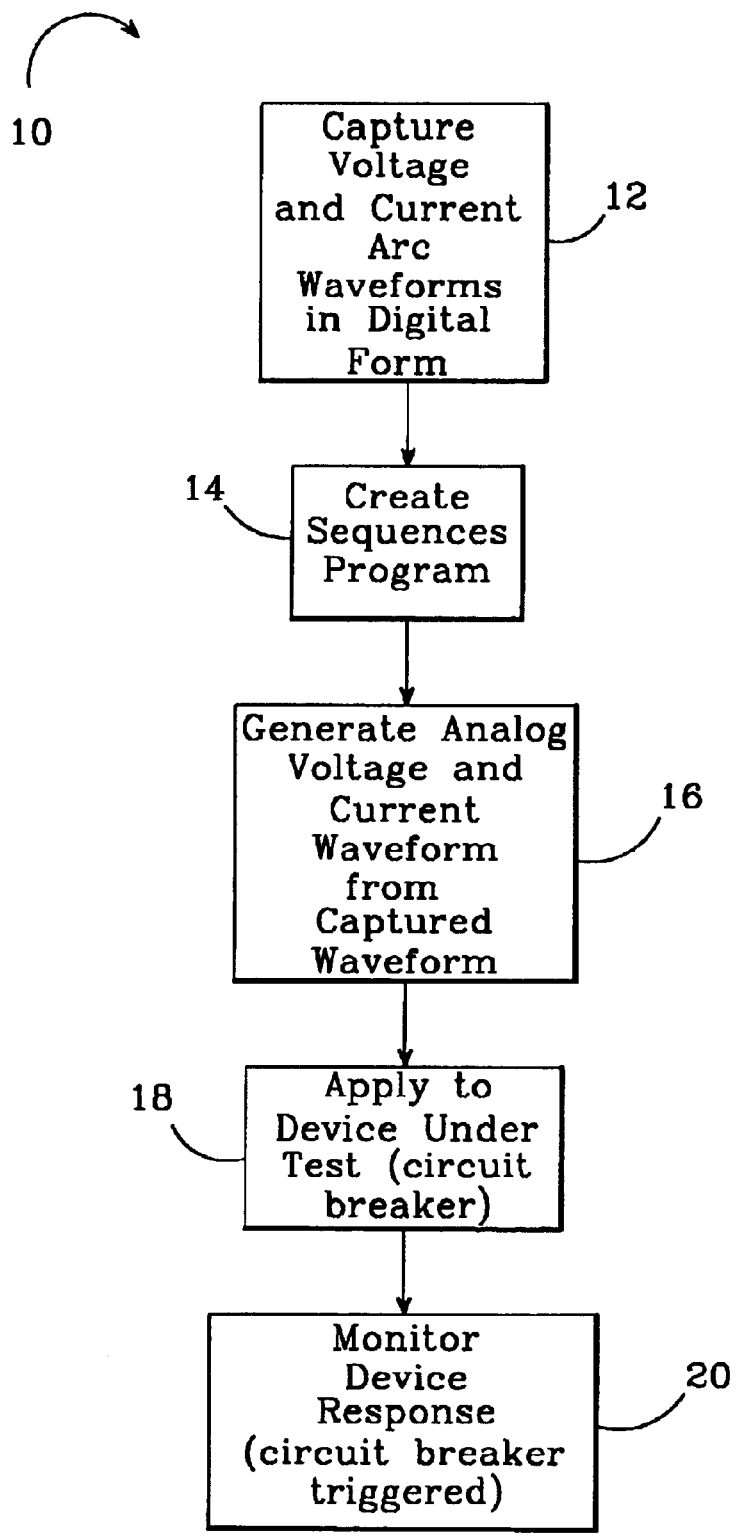
FIG. 1 is a flow diagram of one embodiment of a method according to the present invention for testing a device's response to simulated arcing conditions.

FIG. 1 is a flow diagram showing one embodiment of a method 10 according to the present invention for testing a device's response to an arcing condition. The method is particularly adapted to testing a circuit breaker's response to an arcing condition. In step 12, the current and voltage waveforms of an arcing condition are captured, preferably in digital form, by sampling and recording a variety of actual electrical arcs. Both voltage and current characteristics are sampled in real time and recorded, preserving the time relationships between the voltage and current waveforms.

In step 14, a trigger waveform sequences program is created, which reflects the time relationship between the voltage and current waveforms. The program keeps the waveforms in proper time relationship so that the waveforms can be generated in proper sequence in relation to one another. In step 16 the analog current and digital waveforms are generated from the digital form of the waveforms using the sequences program to synchronize the waveforms. Without the sequences program the waveforms could be generated out of synch such that they do not have the relationship that represents the captured arc condition waveforms.

In step 18, the generated waveforms are applied to a device under test (DUT), which is usually a circuit breaker. Other devices can be tested by the method 10 including but not limited to arc detectors and circuit interrupters. In step 18, a determination is made as to whether the circuit breaker tripped in response to the generated waveform and if so, when the trip occurred. Different waveforms can be applied to the device under test, with only some designed to cause the circuit breaker to trip. In testing using the "must trip" and "must not trip" waveforms, the circuit breaker can be tested to respond appropriately.

Figure 2:
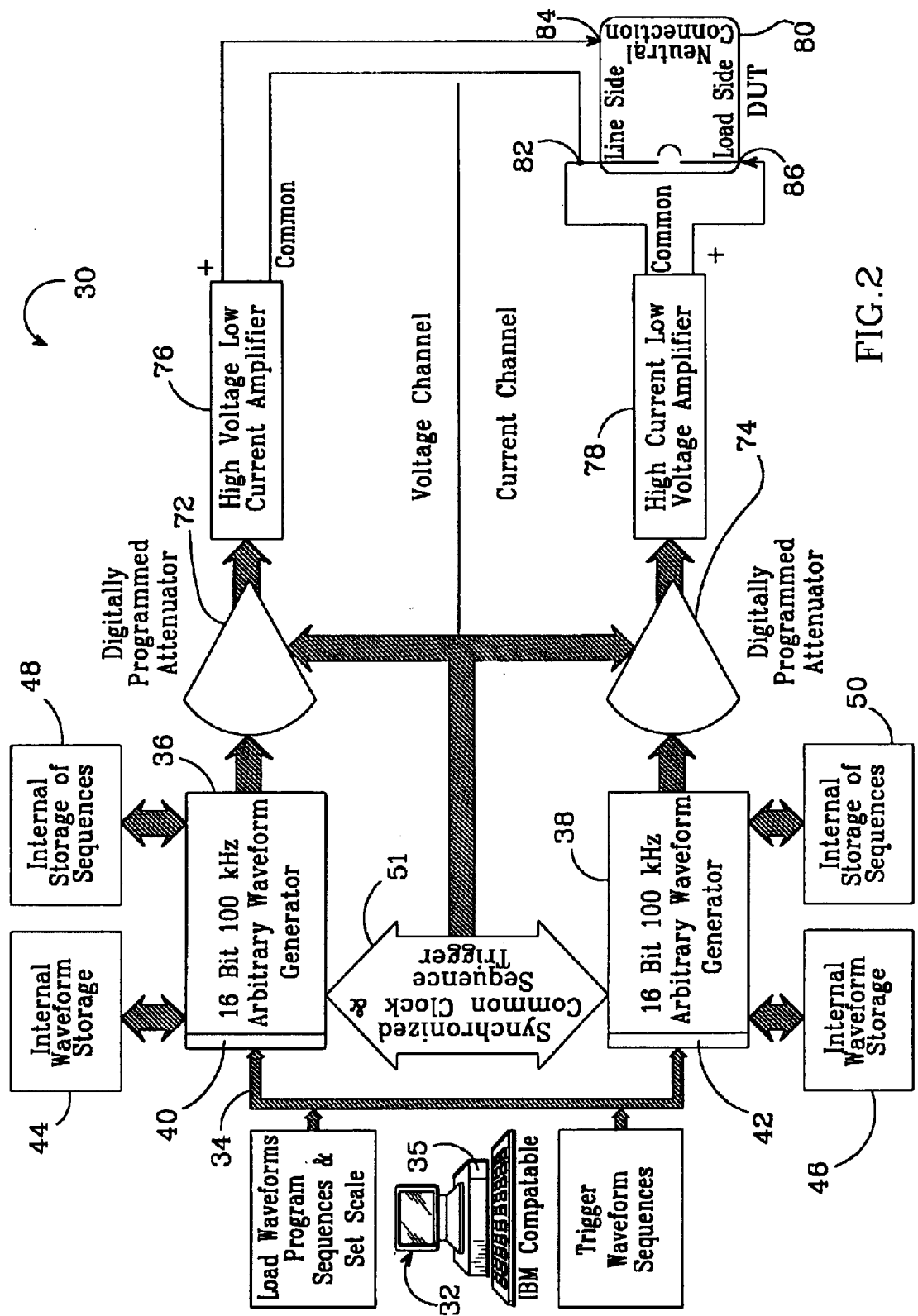
FIG. 2 is a block diagram of one embodiment of an apparatus for simulating arcing conditions according to the present invention.

FIG. 2 shows a block diagram for an apparatus/system 30 for electric arc synthesis and arc detector testing according to the present invention. It includes a computer 32 that includes digital memory and a mechanism for allowing digital representation of waveforms to be loaded into its memory. Some ways for loading the waveforms in memory include transferring from CD or floppy disk, over a bus, or over the Internet. Similarly, a trigger waveform sequences program is loaded into the computer 32. This program controls and correlates the timing and triggering of the two waveforms and commands the waveform generators to repeat certain segments of the waveform. The computer 32 preferably holds digital representations of an electric arc's voltage and current waveform, along with trigger waveform sequences in its memory.

The computer 32 can be any type of computing device with sufficient memory to store the waveforms and sequences, and it should allow a user to communicate over a bus 34. In the preferred system 30, the computer 32 is a personal computer (PC) running a Microsoft Windows operating system and has a commercially available first bus interface/controller 35. The bus 34 can be one of many standard and commercially available buses, with the preferred bus 34 being an IEEE 488 Bus and the preferred controller 35 being an IEEE 488 controller.

The system 30 also has voltage and current arbitrary waveform generators 36, 38, with the voltage waveform generator 36 being dedicated to generating the arc's voltage waveform and the current waveform generator 38 being dedicated to generating the arc's current waveform. The voltage generator 36 has a second bus controller 40 and the current generator 38 has a third bus controller 42, both of which are compatible with the bus 34 and are preferably IEEE 488 controllers.

The digital representation of the arc's voltage waveform is transferred from the computer 32 to the waveform generator 36 over the bus 34, with the first and second bus controllers 35, 40 controlling communication over the bus 34. The waveform is then stored in digital form in the voltage generator's internal waveform storage (RAM) 44. Similarly, the digital representation of the arc's current waveform is transferred from the computer 32 to the waveform generator 38 over the bus 34 under control of the first and third controllers 35, 42. The waveform is then stored in the generators internal current waveform storage (RAM) 46.

A sequences program is also transferred to each of the waveform generators 36, 38 over the bus 34 under control of the bus controllers 35, 40, 42. Respective sequences programs are transferred to the waveform generators 36, 38 with the voltage waveform generator's sequences program being stored in the voltage generator's internal sequences storage 48 and the current waveform generator's sequences program being stored in the current generator's internal sequences storage 50. In other embodiments, the sequences program can be one program that is run separately or simultaneously on the generators 36, 38.

To simulate the arcing condition from the stored date in the generators 36, 38, the voltage and current waveforms should be synchronized in time on a sample by sample basis.

This is accomplished by using a common clock and common trigger signals which are communicated between the two arbitrary waveform generators 36, 38 over control lines 51. When one or both of the generator's sequencing program signals the waveform generators 36, 38 to begin, both generators retrieve the digital form of the waveforms in their respective internal waveform storage 44, 46, and each transforms it retrieved waveform into an analog form waveform. The sequences programs can instruct the waveform generators 36, 38 when to begin the arc test and when to repeat segments of their waveforms, as more fully described below.

Commercially available systems can be used for the voltage and current arbitrary waveform generators 36, 38, with a preferred system being the DAC488HR, 16-bit high resolution digital to analog (D/A) converter with digital input output (I/O) and an IEEE 488 interface, which is provided by IOTech, Incorporated (D/A converter). Some of the important features of the D/A converter include its 16-bit capability at 100 kHz and its 480-ksample internal memory. It is also programmable to control sequencing and looping and can be configured for multi-unit sequencing and looping. Its outputs are full scale programmable to +/− 1, 2, 5, or 10 volt and each output channel is dielectrically isolated.

Figure 3:
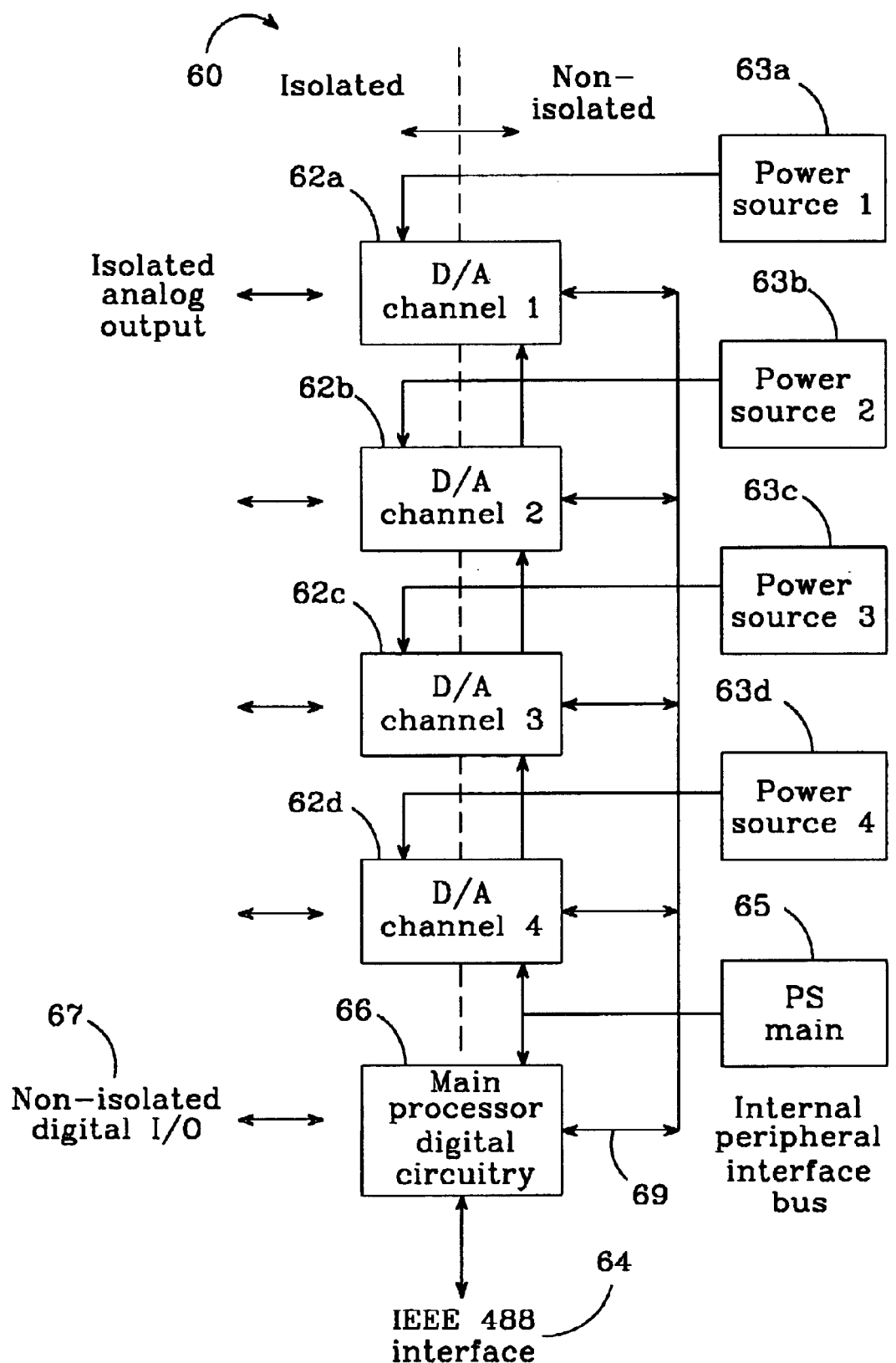
FIG. 3 is a block diagram of one device that can be used as for both the arbitrary waveform generators in the apparatus of claim 2.

FIG. 3 shows a simplified block diagram of the preferred D/A converter 60, which includes four independent analog outputs 62a, 62b, 62c, 62d, each of which is optically isolated from its IEEE 488 bus 64. Each output has its own power source 63a, 63b, 63c, 63d, or a main power source 65 can be used by each. Internal clocks can be used to ensure synchronization or the system can be synchronized to an external clock to synchronize with another D/A converter. The converter 60 also includes non-isolated digital inputs/output 67 coupled to a main processor digital circuitry 66. The circuitry 66 also communicates over the IEEE 488 bus 64 and includes internal memory. An internal peripheral bus 69 is included for internal communication and control in the converter 60.

Referring again to FIG. 2, the output of the voltage waveform generator 36 is coupled to a voltage waveform attenuator 72, and similarly, the current waveform generator 38 is coupled to current waveform attenuator 74. Each of the attenuators 72, 74 are digitally programmable to scale the outputs of the generators. During the initial capture of the arc's waveforms the scaling of the acquisition equipment is set so that peak voltages and currents are as close as practical to the maximum full scale of the digitizer without causing saturation. This is done to preserve the number of bits of resolution on lower current waveforms. Accordingly, there should be a reverse process during reproduction of the waveforms and the digitally programmed attenuators 72, 74 set the full scale values represented by the waveform generators 36, 38.

The scaling information is preferably included as part of the sequences program as set scale. It is loaded into the generators 36, 38 with the sequences program and as the analog waveforms are being generated, the waveforms are scaled so that the maximum of the signal is the maximum scale sent to the amplifiers.

A beneficial by-product of including the attenuators 72, 74 is that the waveforms captured at one scale may be artificially reproduced at a different scale. Every waveform can be digitally manipulated so its peak values drive the amplifiers to full output, or attenuated to whatever levels are represented by the capabilities of the attenuators 72, 74. This allows currently available waveforms to be manipulated, which helps address the current lack of waveforms representing devices or circuit breakers under load. In the D/A converter 60 shown in FIG. 3, the attenuator is included in the main processor digital circuitry 70.

The output of the voltage waveform attenuator 72 is coupled to a high voltage low current amplifier 76, whose output is in turn coupled to the device under test (DUT) 80. The output of the current waveform attenuator 74 is coupled to a high current low voltage amplifier 78, whose output is also coupled to the DUT 80. In most instances, the DUT 80 is a circuit breaker, although it can be other devices as well.

In the system 30 it is not necessary to dissipate large amounts of power to simulate the environment seen by the circuit breaker 80. Dielectric isolation of the contacts and the ability of the contacts to interrupt current flow under high voltage can be tested separately. In the embodiment shown it is not necessary to simulate high voltage across the contacts when the circuit breaker opens. In the embodiment in FIG. 2, the system 10 tests arc waveform discrimination by the circuit breaker 70. Accordingly, the amplifiers 76, 78 do not need to output large amounts of power in order to test a circuit breaker 80 in a high powered environment.

The high voltage low current amplifier 76 is coupled across the circuit breaker's line side terminal 82 and neutral connection 84. The amplifier's common line is coupled to the line side 82 and the amplifier's plus line attached to the neutral connection 84. The amplifier 76 should supply a relatively high voltage at very small currents because the circuit breaker 80 only sees high voltage between its line side terminal 82 and the neutral connection 84, with the neutral connection 84 drawing very little current. In the system 30, a circuit breaker trip terminates the test, so the primary focus of the test is determining whether the circuit breaker tripped and when, not what happened after it tripped.

Commercially available amplifiers can be used for the high voltage low current amplifier 76, some of which include the A.A. Lab System Ltd. A-303 Piezo Amplifier and the AVTECH AV-110A-PS, AV-110B-PS, AV110G-PS and AV-112-PS amplifiers. The amplifier 76 should have a bipolar output with at least 200 volts peak, and can also have a wider range of peak output of approximately 300 volts for surge testing. Other voltage levels can also work. The current capability of the amplifier should be approximately 0.1 amp, although other current capabilities will also work.

The high current low voltage amplifier 78 is coupled across the circuit breaker's line side and load side terminals 82, 86. The amplifier 78 should generate very high currents, but only needs to do so at very low voltages because the voltage drop across the terminals 82, 86 is very low in the untripped state.

The preferred amplifier 78 should be solid state and is powered by batteries that provide approximately +/− 24 volts, with suitable batteries being lead acid batteries. A standard 115-volt outlet does not provide an adequate current source, and by using batteries for peak current draw, an adequate current can be supplied. The amplifier circuitry sources current from the lead acid batteries and floating chargers are included to keep the batteries at an operating level. However, the chargers are usually powered by a common 115-volt outlet. Accordingly, the amplifier 78 includes ultra isolation transformers to keep the 115-volt power isolated from the remainder of the amplifier 78.

The amplifier 78 should provide more than approximately +/−50 amperes RMS continuous, with a 500 amperes peak. It should also provide approximately +/−15 volts output at peak current and +/−20 volts output at 50 amperes. The bandwidth should be greater than 50 kHz, with load impedances of approximately 0 to 0.5 ohms. However, many different operating characteristics can also be used for the amplifier 78.

Figure 4:
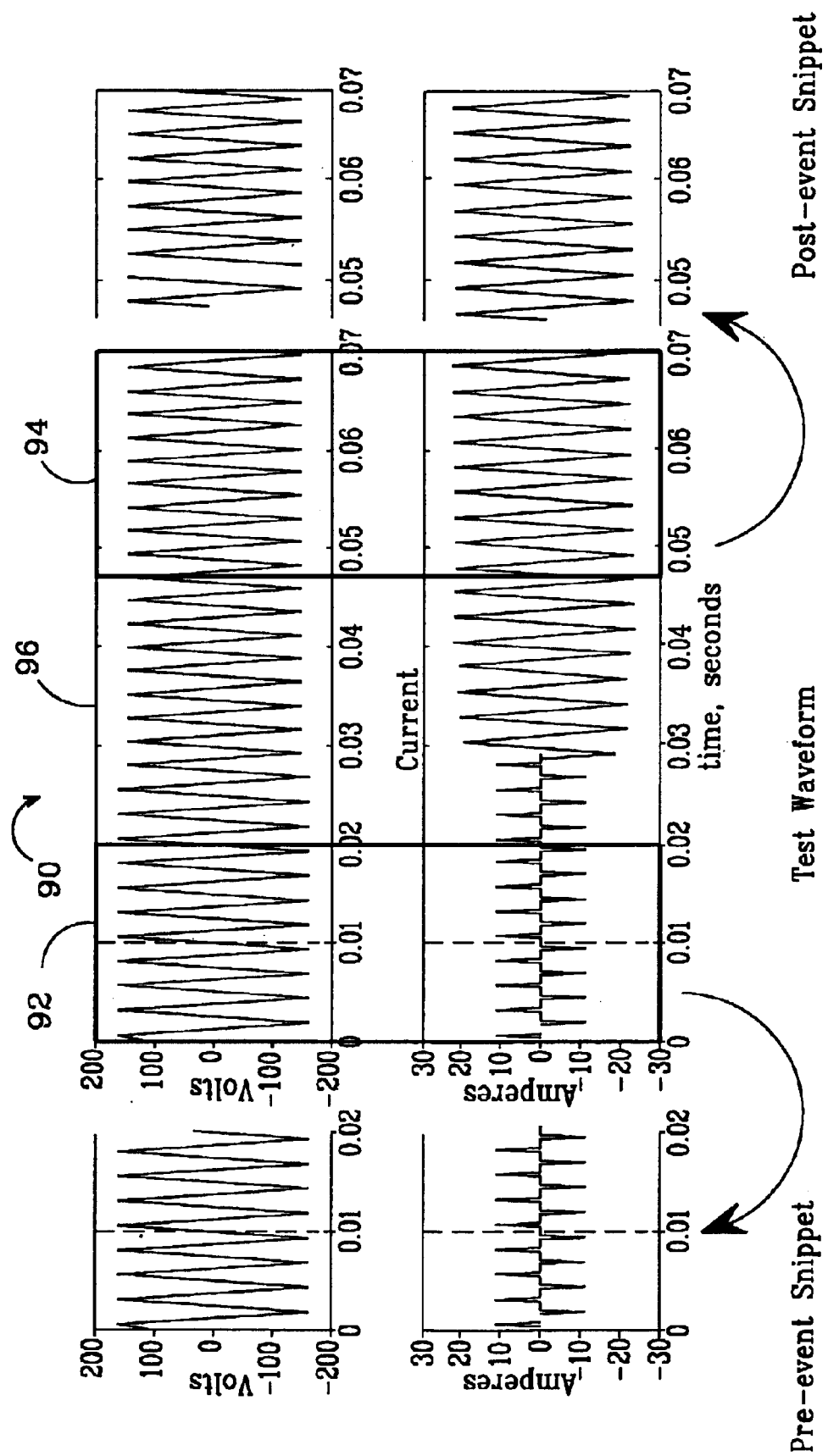
FIG. 4 shows a sample waveform using pre and post event looping according to the present invention.

Many arcing events have a very short term, and the captured data usually includes the event and the waveform immediately before and after the event. Most arc events take place as an occurrence during a steady state condition, which is not practical to capture because the data sets would be large and unwieldy. As shown in FIG. 4, a continuous waveform 90 can be produced from pre-event steady state waveform snippet 92, a post-event steady state waveform snippet 94, and the arc event test waveform 96. The pre-event snippet 92 can be repeated in the waveform generators such that it appears as a continuous waveform representing the waveform's pre-event steady state. The end of the pre-event snippet 92 is also constructed so that it forms a smooth transition to the test waveform 96.

At the beginning of the arc test, the pre-event snippet 92 is continuously repeated and output from the waveform generators 36, 38. When the test trigger is given from the sequences program, the pre-event snippet 92 completes and then smoothly transitions into the test waveform 96.

Similarly, when the test waveform 96 completes, the waveform generators 36, 38 are programmed to trigger the post event snippet 94 and then repeat it. The post event snippet 94 is constructed such that its beginning makes a continuous flow with the end of the test waveform 96, and it produces a continuous waveform when it is repeated.

The waveform snippets 92, 94, and the test waveform 96 are loaded into the waveform generators 36, 38 along with the repeat and trigger commands of the sequences program. Typical repeats commands allow for repeating a snippet in the range of 10–100 times. By using pre- and post-condition snippets, less memory is needed in the waveform generators 16, 18 for saving the arc waveforms. As a result, the waveforms can be saved with greater fidelity.

Figure 5A:
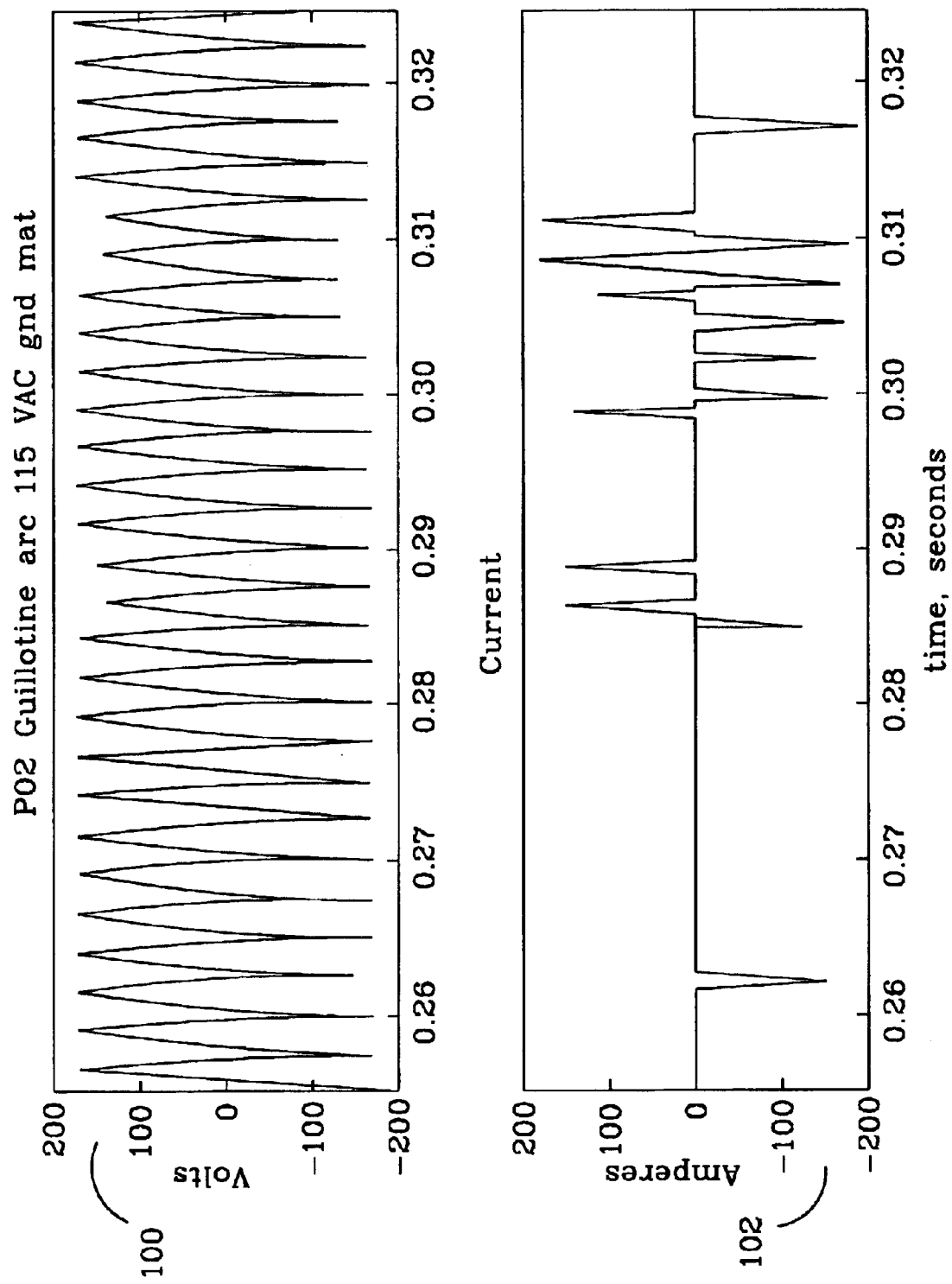
FIG. 5a shows a voltage and current waveform that can be used by the apparatus to simulate arcing conditions.
Figure 5B:
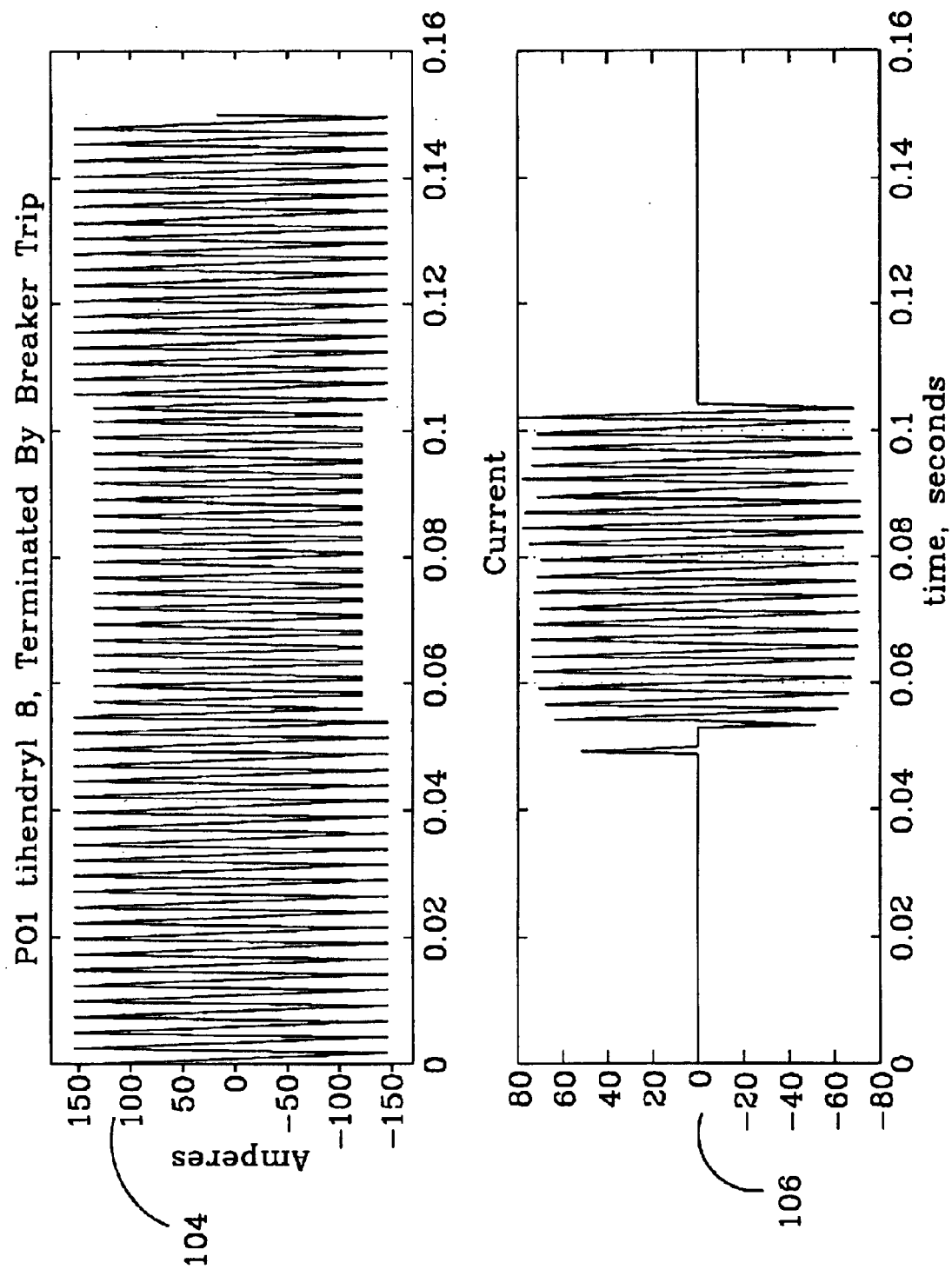
FIG. 5b shows a second voltage and current waveform that can be used by the apparatus to simulate a different arcing condition.

FIGS. 5a and 5b show two different arcing condition waveforms that can be used in the system 30 and should cause the arc fault circuit breaker 80 to trip, although many other waveforms can also be used. FIG. 5a shows a voltage waveform 100 and current waveform 102 that are referred to as guillotine type waveforms. The waveforms are captures from a guillotine arc simulation where a thin blade is driven through two conductors. This creates conditions making it more likely that conductive material is first dispersed as an arc and then replaced to generate additional events as the blade is driven further downward. This results in a high number of arcing events, which is not necessarily representative of real world conditions. However, this event-rich waveform can make it easier to evaluate arc detection performance because there are many events to eventually cause a circuit breaker trip.

FIG. 5b shows a voltage waveform 104 and current waveform 106 that are referred to as sustained arcing waveforms. The waveforms show varying characteristics during arcing which is useful in circuit breaker evaluation. The waveform 104, 106 have a fairly sustained level of arcing for a period of time, and as a result, they are useful for the evaluation of series arc protection.

The waveform generators 36, 38 can be used to manipulate currently available arc waveforms to simulate many different waveforms and testing conditions. Waveforms may be digitally summed to produce combination waveforms. For example, a waveform of an arc may be superimposed on a load waveform to test a circuit breaker's arc detection in the presence of a load. A variety of other waveform shaping techniques can be used to allow simulation of complex arcing waveforms. Scaling, truncation, and waveform combination are also preferably used to extend the range of waveforms while preserving efficient use of storage space.

While several illustrative embodiments of the invention have been shown and described, numerous variations and alternate embodiments will occur to those skilled in the art. The method 10 can include different steps and the steps can be in different order. The system 30 can include many different devices and circuits and the amplifiers can apply have different characteristics and apply different waveforms to device under test. Such variations and alternate embodiments are contemplated, and can be made without departing from the spirit and scope of the invention as defined in the appended claims.

I claim:

1. A system for synthesizing electrical arcs for arc detector testing using the arc's captured current and voltage waveforms, comprising:

a voltage waveform generator to generate an analog form voltage waveform from a digital form of an arc's captured voltage waveform; and a current waveform generator to generate an analog form current waveform from a digital form of an arc's captured current waveform, said analog form voltage and current waveforms sequenced in time to synthesize the arcing condition created by said arc's current and voltage waveforms.

2. The system of claim 1, wherein said voltage and current waveform generators comprise respective digital to analog converters with control lines therebetween carrying control signals to sequence said waveforms.

3. The system of claim 1, wherein the output of said voltage waveform and current waveform generators have respective attenuators to scale the analog current and voltage waveforms.

4. The system of claim 1, wherein said analog form voltage and current waveforms are applied to a device to monitor its response to the waveforms.

5. The system of claim 1, further comprising an apparatus for capturing said digital form of an arc's voltage and current waveform.

6. The system of claim 5, further comprising a means for creating a sequences program to control the sequencing of said arc voltage and current waveforms.

7. A system for arc detection testing using synthesized arcs, comprising:

a voltage waveform generator for generating an arc's analog voltage waveform from a digital form of an arc's captured voltage waveform;

a current waveform generator to generate an arc's analog current waveform from a digital form of an arc's current waveform, said voltage and current waveforms sequenced in time to synthesize the timing of the arc's current and voltage waveforms;

a voltage waveform amplifier, the output of said voltage waveform generator connected in circuit with the input of said voltage waveform amplifier;

a current waveform amplifier, the output of said current waveform generator connected in circuit with the input of said current waveform amplifier; and a device under test, the output of said voltage waveform amplifier and said current waveform amplifier connected in circuit to said device under test to test its response to the said voltage and current analog waveforms.

8. The system of claim 7, wherein said voltage and current waveform generators are each a digital to analog converter.

9. The system of claim 7, further comprising a voltage waveform attenuator to scale the output of said voltage waveform generator.

10. The system of claim 9, said voltage waveform attenuator is connected in circuit between said voltage waveform generator and said voltage waveform amplifier.

11. The system of claim 7, further comprising a current waveform attenuator to scale the output of said current waveform generator.

12. The system of claim 11, wherein said current waveform attenuator is connected in circuit between said current waveform generator and said current waveform amplifier.

13. The system of claim 7, wherein said voltage waveform amplifier is a high voltage low current amplifier.

14. The system of claim 7, wherein said current waveform amplifier is a high current low voltage amplifier.

15. The system of claim 7, wherein said device under test is a circuit breaker, said system testing whether said circuit breaker trips in response to said analog current and voltage waveforms.

16. The system of claim 7, wherein said digital form of an arc's captured voltage waveform comprises snippets of pre and post arcing steady states for said waveform, said voltage waveform generator generating a plurality of waveforms from said pre and post condition snippets to generate the waveform's pre and post arcing steady states.

17. The system of claim 7, wherein said digital form of an arc's captured current waveform comprises snippets of pre and post arcing steady states for said waveform, said current waveform generator generating a plurality of waveforms from said pre and post condition snippets to generate the waveform's pre and post arcing steady states.

18. The system of claim 7, wherein said voltage and current waveform generators can each combine other waveforms with their respective generated waveforms.

19. The system of claim 7, wherein said voltage and current waveform generators can modify their respective generated waveforms.

20. The system of claim 7, wherein said device under is tested for its ability to discriminate arcing condition voltage and current waveforms from non-arcing condition voltage and current waveforms.

21. The system of claim 7, wherein voltage and current waveform amplifiers apply waveforms to said device under test that simulate a high power environment without utilizing high power waveforms.

22. A method for testing a devices response to an arcing condition, comprising:
   capturing an electric arc's voltage and current waveforms in digital form;
   generating an analog form voltage waveform from said captured digital form voltage waveform;
   generating an analog form current waveform from said captured digital current waveform;
   applying said analog form voltage and current waveforms to a device under test; and
   monitoring said device to determine its response to said analog waveforms.

23. The method of claim 22, further comprising the intermediate step of generating a sequencing program for controlling the timing between said arc's voltage and current waveforms so the waveforms in combination synthesize an arcing condition.

24. The method of claim 22, wherein said device is a circuit breaker, said monitoring step determining whether said circuit breaker is tripped.

25. The method of claim 22, wherein said digital form of an arc's captured voltage waveform comprises snippets of pre and post arcing steady states for said waveform, said step of generating a analog form of the voltage waveform further comprising:
   generating a plurality of waveforms from said pre arcing snippet;
   generating an voltage arcing condition waveform; and
   generating a plurality of waveforms from said post arcing snippet, all of which in combination comprise said analog form voltage waveform.

26. The method of claim 22, wherein said digital form of an arc's captured current waveform comprises snippets of pre and post arcing steady states for said waveform, said step of generating a analog form of the current waveform further comprising:
   generating a plurality of waveforms from said pre arcing snippet;
   generating a current arcing condition waveform; and
   generating a plurality of waveforms from said post arcing snippet, all of which in combination comprise said analog form current waveform.

27. A system for arc detection testing using synthesized arcs, comprising:
   a means for generating an arc's analog form voltage waveform from a digital form of an arc's captured voltage waveform;
   a means for generating an arc's analog form current waveform from a digital form of an arc's current waveform; and
   a device under test, said analog form current and voltage waveforms applied to said device under test to test its response to the said voltage and current analog waveforms.

28. The system of claim 27, further comprising a means for capturing said digital form of an arc's captured voltage and current waveform from and arcing event and providing said digital form waveforms to said means for generating an arc's analog form current and voltage waveform.

29. The system of claim 27, further comprising a voltage waveform amplifier, said analog form voltage waveform coupled through said voltage waveform amplifier and to said device under test.

30. The system of claim 27, further comprising a current waveform amplifier, said analog form current waveform coupled through said current waveform amplifier to said device under test.

31. The system of claim 27, where said analog for voltage and current waveforms are sequenced in time to synthesize the timing of the arc's current and voltage waveforms.

32. The system of claim 27, wherein said means for generating an arc's analog form current waveform and said means for generating an arc's analog form voltage waveform comprise respective digital to analog converters.

33. The system of claim 27, further comprising a voltage waveform attenuator to scale said arc's analog form voltage waveform.

34. The system of claim 33, said voltage waveform attenuator is connected in circuit between said voltage waveform generator means and said device under test.

35. The system of claim 27, further comprising a current waveform attenuator to scale said arc's analog for current waveform.

36. The system of claim 35, wherein said current waveform attenuator is connected in circuit between said current waveform generator means and said device under test.

37. The system of claim 27, wherein said device under test is a circuit breaker, said system testing whether said circuit breaker trips in response to said analog current and voltage waveforms.

38. The system of claim 27, wherein said digital form of an arc's captured voltage waveform comprises snippets of pre and post arcing steady states for said waveform, said voltage waveform generator means generating a plurality of waveforms from said pre and post condition snippets to generate pre and post arcing steady states of said analog form voltage waveform.

39. The system of claim 27, wherein said digital form of an arc's captured current waveform comprises snippets of pre and post arcing steady states for said waveform, said current waveform generator generating a plurality a plurality of waveforms from said pre and post condition snippets to generate pre and post arcing steady states of said analog form current waveform.

40. The system of claim 27, wherein said voltage and current waveform generators means can each combine other waveforms with their respective generated waveforms.

41. The system of claim 27, wherein said voltage and current waveform generators means can modify their respective generated waveforms.

42. The system of claim 27, wherein said device under is tested for its ability to discriminate arcing condition voltage and current waveforms from non-arcing condition voltage and current waveforms.

43. The system of claim 27, wherein said analog form current and voltage waveforms applied to said device under test simulate a high power environment without utilizing high power waveforms.

* * * * *